US010151972B2

(12) United States Patent
Hashimoto et al.

(10) Patent No.: US 10,151,972 B2
(45) Date of Patent: Dec. 11, 2018

(54) MANUFACTURING METHOD OF PHOTOMASK AND RECORDING MEDIUM

(71) Applicant: TOSHIBA MEMORY CORPORATION, Minato-ku (JP)

(72) Inventors: Takaki Hashimoto, Yokohama (JP); Satoshi Usui, Nagoya (JP); Naoki Sato, Yokkaichi (JP); Kouichi Nakayama, Hiratsuka (JP); Masahiro Miyairi, Yokohama (JP); Syogo Okamoto, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 134 days.

(21) Appl. No.: 15/446,544

(22) Filed: Mar. 1, 2017

(65) Prior Publication Data

US 2018/0157167 A1 Jun. 7, 2018

Related U.S. Application Data

(60) Provisional application No. 62/430,381, filed on Dec. 6, 2016.

(51) Int. Cl.
*G03F 1/70* (2012.01)
(52) U.S. Cl.
CPC ..................... *G03F 1/70* (2013.01)
(58) Field of Classification Search
CPC ........................................ G03F 1/70

USPC .............................................. 430/5
See application file for complete search history.

(56) References Cited

U.S. PATENT DOCUMENTS

| | | | |
|---|---|---|---|
| 6,801,297 B2 | 10/2004 | Nakae | |
| 2005/0130045 A1 | 6/2005 | Ozawa | |
| 2016/0268278 A1 | 9/2016 | Kono et al. | |

FOREIGN PATENT DOCUMENTS

| | | |
|---|---|---|
| JP | 2004-47755 | 2/2004 |
| JP | 2005-165248 | 6/2005 |
| JP | 2010-267570 | 11/2010 |
| JP | 5077656 | 11/2012 |
| JP | 5673947 | 2/2015 |

*Primary Examiner* — Christopher G Young
(74) *Attorney, Agent, or Firm* — Oblon, McClelland, Maier & Neustadt, L.L.P.

(57) ABSTRACT

A manufacturing method of a photomask according to the embodiment sets an exposure condition applied when a resist is formed into a three-dimensional target shape by using a photomask including a plurality of light-shielding areas. Subsequently, the method sets a hypothetical target shape obtained by correcting a target shape based on a development characteristic of the resist for the exposure condition. Subsequently, the method creates a pattern of the photomask corresponding to the hypothetical target shape. Subsequently, the method simulates a prediction shape of the resist when the pattern is used. Subsequently, the method calculates a cost function related to an error between the prediction shape and the hypothetical target shape. Subsequently, the method adjusts the pattern based on a result of the calculation of the cost function.

10 Claims, 7 Drawing Sheets

MANUFACTURING METHOD OF PHOTOMASK AND RECORDING MEDIUM

CROSS-REFERENCE TO RELATED APPLICATIONS

This application is based upon and claims the benefit of priority from U.S. Provisional Application No. 62/430,381, filed on Dec. 6, 2016; the entire contents of which are incorporated herein by reference.

FIELD

Embodiments of the present invention relate to a manufacturing method of a photomask, and a recording medium.

BACKGROUND

In formation of a pattern of a semiconductor element, a resist is fabricated into a three-dimensional shape by using a photomask in some cases. In such a case, a pattern of the photomask is set based on, for example, thickness data of a resist remaining for an exposure amount.

DETAILED DESCRIPTION

Embodiments will now be explained with reference to the accompanying drawings. The present invention is not limited to the embodiments.

A manufacturing method of a photomask according to the embodiment sets an exposure condition applied when a resist is formed into a three-dimensional target shape by using a photomask including a plurality of light-shielding areas. Subsequently, the method sets a hypothetical target shape obtained by correcting the target shape based on a development characteristic of the resist for the exposure condition. Subsequently, the method creates a pattern of the photomask corresponding to the hypothetical target shape. Subsequently, the method simulates a prediction shape of the resist when the pattern is used. Subsequently, the method calculates a cost function related to an error between the prediction shape and the hypothetical target shape. Subsequently, the method adjusts the pattern based on a result of the calculation of the cost function.

First Embodiment

Figure 1:
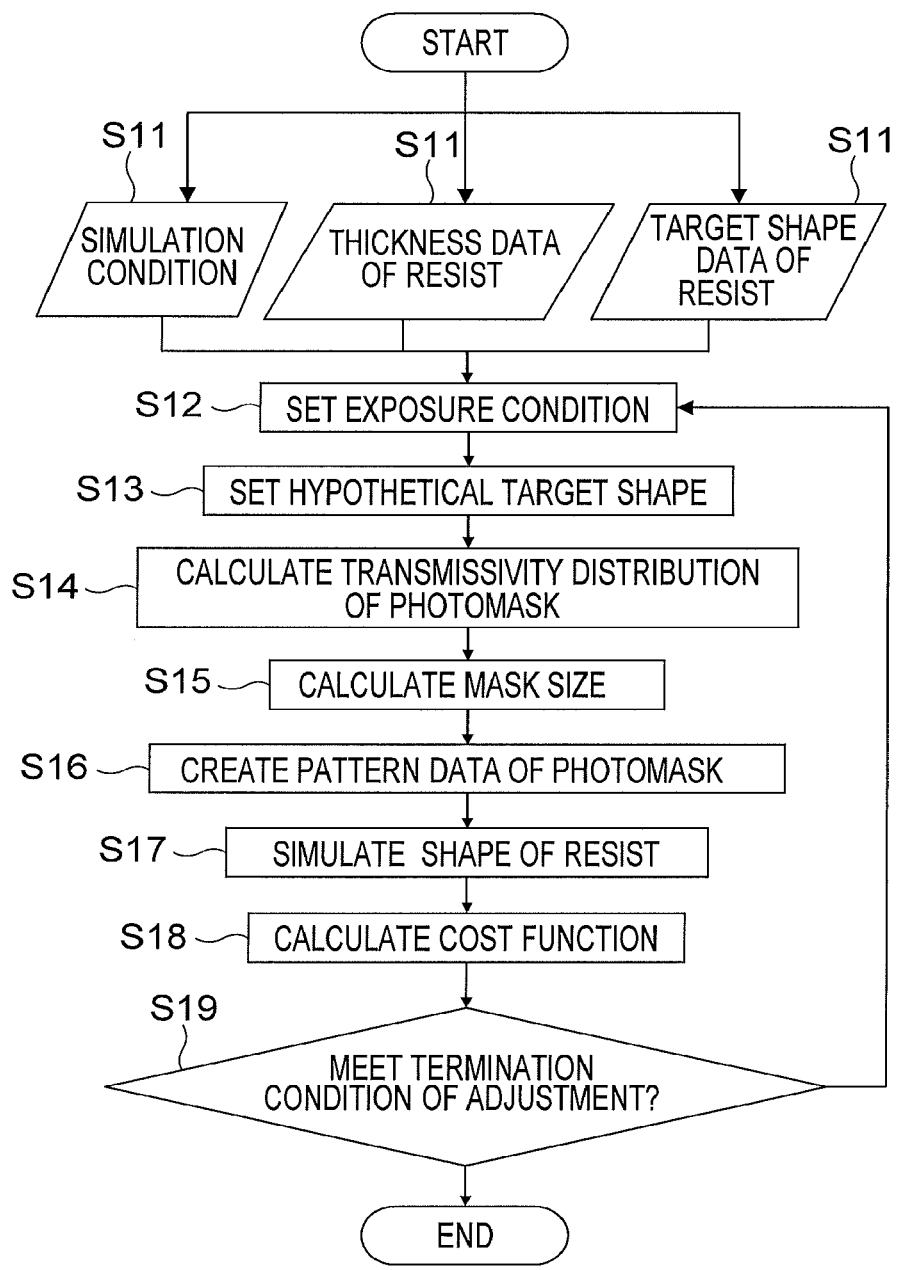
FIG. 1 is a flowchart showing steps of manufacturing a photomask according to a first embodiment.

FIG. 1 is a flowchart showing steps of manufacturing a photomask according to a first embodiment. These manufacturing steps can be recorded, for example, in a non-transitory recording medium as a computer-readable program. This computer can be included in, for example, a simulation apparatus to predict the shape of a resist based on a pattern of a photomask or the like.

Figure 2:
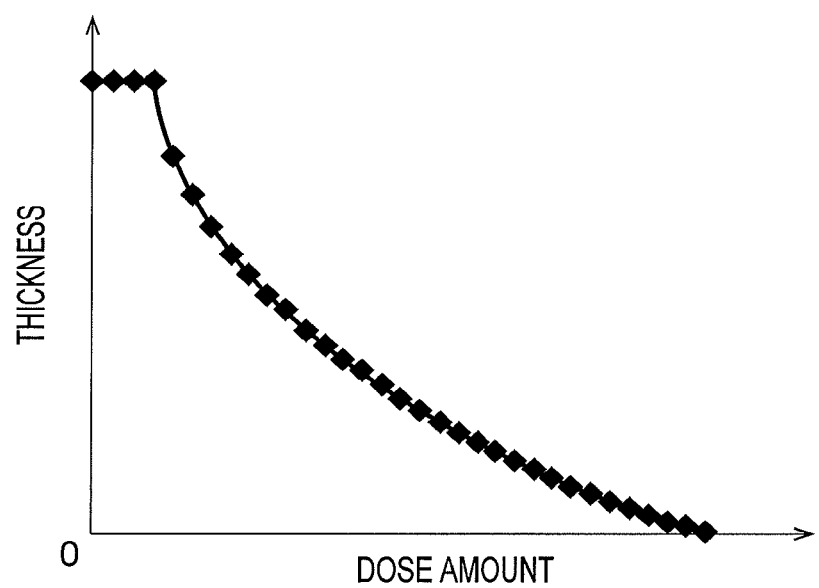
FIG. 2 is a diagram showing exemplary thickness data of a resist according to the first embodiment.

In the embodiment, at first, a simulation condition, thickness data of the resist, and shape data of the resist are inputs to the above-described simulation apparatus (step S11). The simulation condition is a setting condition of a physicochemical model reflecting a physicochemical characteristic of the resist against, for example, heat and acid. The thickness data indicates the thickness of a resist film remaining for a dose amount (exposure amount) as shown in FIG. 2. In the embodiment, the thickness of the resist film decreases as the dose amount increases.

Figure 3:
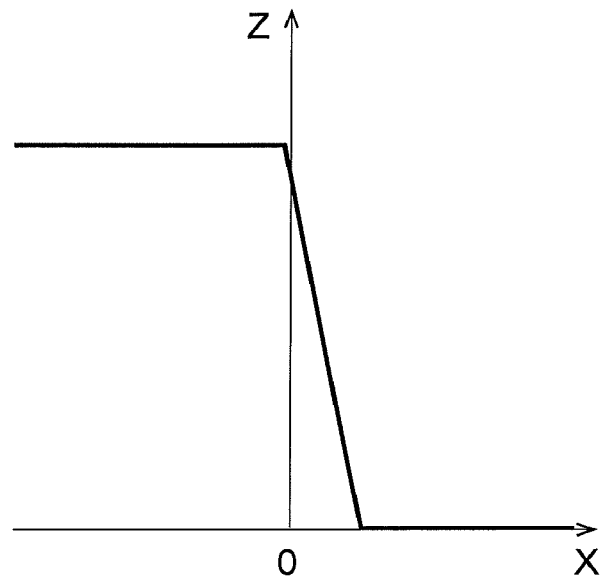
FIG. 3 is a diagram showing an exemplary target shape of the resist according to the first embodiment.

As shown in FIG. 3, the shape data of the resist indicates a target shape actually formed by using a photomask. FIG. 3 shows the target shape with two-dimensional coordinate axes. However, the actual shape data is three-dimensional data represented with three-dimensional coordinate axes.

Subsequently, an exposure condition applied when the target shape is formed is set based on the above-described thickness data and shape data (step S12). This exposure condition includes at least one of, for example, an exposure wavelength, the numerical aperture (NA) of a projection lens, an exposure amount, a focus value, the transmissivity of a photomask, and the luminance distribution of a light source.

Subsequently, a hypothetical target shape is set (step S13). The hypothetical target shape is obtained by correcting the target shape based on a development characteristic of the resist for the above-described exposure condition. The development characteristic of the resist includes physicochemical characteristics in the horizontal direction, such as blurring of an optical image and acid diffusion.

Figure 4:
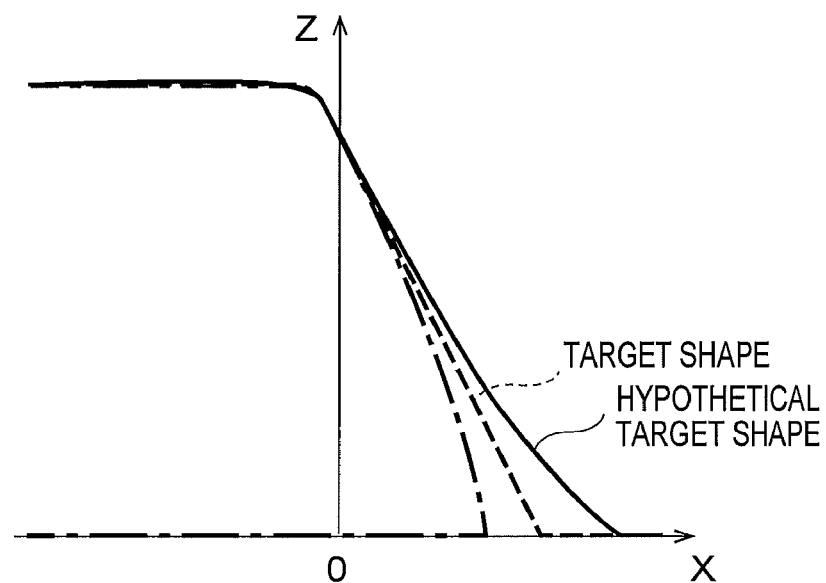
FIG. 4 is a diagram showing an exemplary hypothetical target shape of the resist according to the first embodiment.

When the pattern of the photomask is created only based on, for example, the above-described thickness data, the resist is fabricated into a shape as shown with the dashed and single-dotted line in FIG. 4 due to the development characteristic of the resist in the horizontal direction in some cases. In such a case, a shape error from a target shape shown with the dotted line occurs at a lower end part of the resist.

In the embodiment, a hypothetical target shape with the development characteristic of the resist taken into account in advance is set as shown with the solid line in FIG. 4. Development characteristic data for setting the hypothetical target shape may be input together with any other data at step S11 or may be stored in the simulation apparatus in advance.

Figure 5:
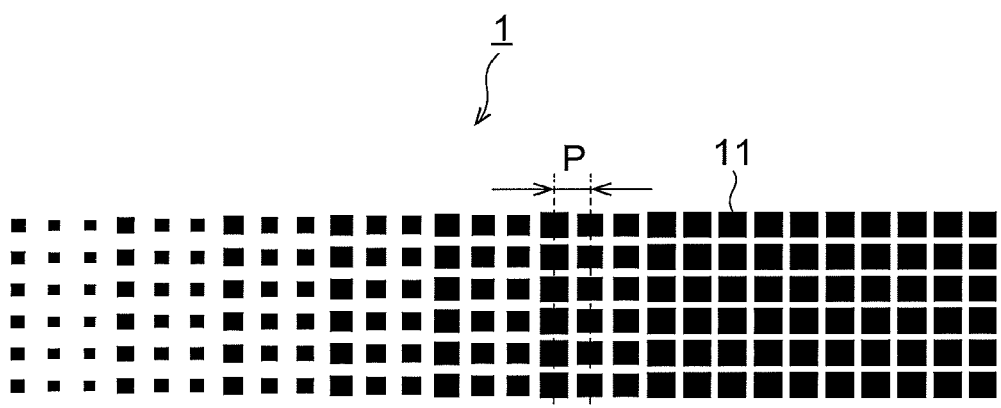
FIG. 5 is a plan view showing an exemplary pattern of the photomask according to the first embodiment.

When the hypothetical target shape is set, a pattern of the photomask corresponding to the set hypothetical target shape is created. FIG. 5 is a plan view showing an exemplary pattern of the photomask. A photomask 1 shown in FIG. 5 includes a plurality of light-shielding areas 11 arranged in a dotted pattern. Each light-shielding area 11 has a property of transmitting light from a light source to some extent instead of completely shielding the light.

In the embodiment, to create the pattern of the photomask, distribution of a transmissivity t of the light-shielding area 11 necessary for forming the hypothetical target shape is firstly calculated (step S14). The transmissivity t is calculated by using Expression (1) below. In Expression (1), "Do" means the intensity of incident light on the light-shielding area 11, and "De" means the intensity of transmitted light from the light-shielding area 11.

$$t = De/Do \qquad (1)$$

Subsequently, a size w of each light-shielding area 11 is calculated based on the above-described distribution of the transmissivity (step S15). The size w is calculated by using Expression (2) below. In Expression (2), "P" means a pitch between the light-shielding areas 11.

$$w = P(1 - \sqrt{t}) \qquad (2)$$

Thereafter, the size w of each light-shielding area 11 is adjusted to the value calculated at step S15. In this manner, pattern data of the photomask is created (step S16).

Subsequently, a prediction shape of the resist using the above-described pattern data is simulated (step S17). Then, the shape of the resist is predicted based on the simulation condition input at step S11.

At step S17, the simulation is preferably performed under another exposure condition with a different exposure amount as well as the exposure condition set at step S12. In this manner, the shape of the resist when the exposure amount has fluctuations can be predicted by performing the simulation a plurality of times.

Figure 6:
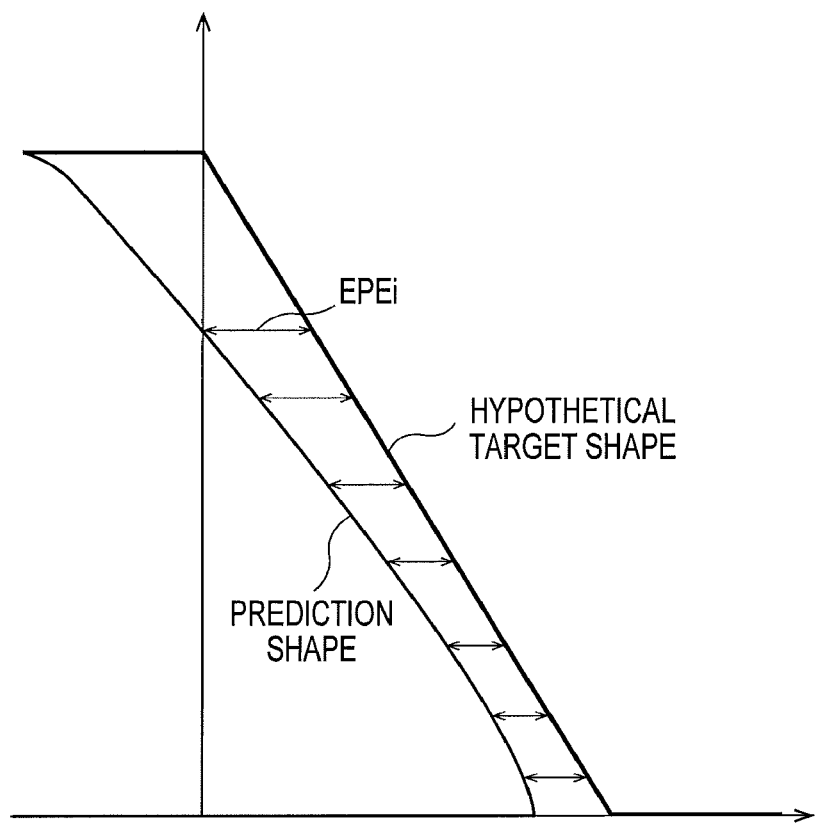
FIG. 6 is a diagram for description of an edge placement error.

Subsequently, a cost function related to an error between the prediction shape and the hypothetical target shape is calculated (step S18). In the embodiment, the cost function is calculated by using Expression (3) below. In Expression (3), "EPE" means a positional shift in the horizontal direction between an edge of the prediction shape and an edge of the hypothetical target shape as shown in FIG. 6, which is called an edge placement error.

$$C.F. = EPE_{RMS} = \sqrt{\frac{\sum_{i=0}^{N}(EPEi)^2}{N}} \qquad (3)$$

According to Expression (3), in the embodiment, the root mean square (RMS) of the edge placement error is used as the cost function. When the simulation is performed under the plurality of exposure conditions at step S17, the cost function calculates the sum of the root mean square of the edge placement error corresponding to each exposure condition.

Subsequently, whether a calculated value of the cost function meets a termination condition for the pattern adjustment of the photomask is determined (step S19). For example, the pattern adjustment of the photomask is terminated if the calculated value of the cost function is equal to or less than a threshold, or if the number of times of calculation of the cost function reaches a predetermined number of times.

If the above-described termination condition is not met, the operations at steps S12 to S18 are repeated. In this repetition, in the embodiment, a numerical value optimization algorithm that minimizes the error between the hypothetical target shape and the prediction shape, in other words, a value calculated through the above-described Expression (3), is used to set the exposure condition again and change at least one of the size and position of each light-shielding area 11. As a result, an optimum pattern of the photomask is derived. Accordingly, an error between the shape of a resist formed by using this pattern of the photomask and the target shape (refer to FIG. 3) becomes extremely small.

According to the embodiment described above, the hypothetical target shape with the development characteristic of the resist in the horizontal direction taken into account is set so as to adjust an optimum pattern of the photomask for the hypothetical target shape. When the adjusted pattern of the photomask is used to fabricate the resist, an error from the target shape can be improved.

In the embodiment, when the shape of the resist is simulated under a plurality of exposure conditions, the pattern of the photomask is optimized through the cost function that takes into account the EPE of each exposure condition. Accordingly, influence of fluctuation in the exposure amount on the actual shape of the resist can be minimized.

Second Embodiment

Steps of manufacturing a photomask according to a second embodiment will be described with focus on any difference from those of the first embodiment. In the thickness data used at step S11 in the first embodiment, the dose amount is set up to the thickness of the resist being zero, as shown in FIG. 2. According to the thickness data, no pattern of the photomask exists in an area outside of the resist film. With this configuration, when the above-described outside area is irradiated with high-energy light due to, for example, defocus, the light potentially reaches the resist and adversely affects the shape of the resist.

Figure 7:
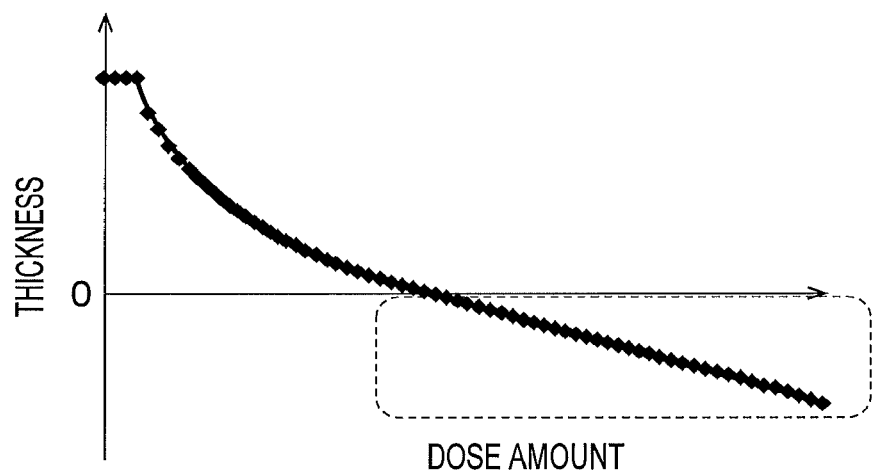
FIG. 7 is a diagram showing exemplary thickness data of a resist according to a second embodiment.

To avoid this, in the embodiment, the thickness data of the resist includes hypothetically negative thickness data as shown in the dotted-line region in FIG. 7. The dose amount corresponding to the negative thickness data is larger than the dose amount when the thickness is zero.

Figure 8:
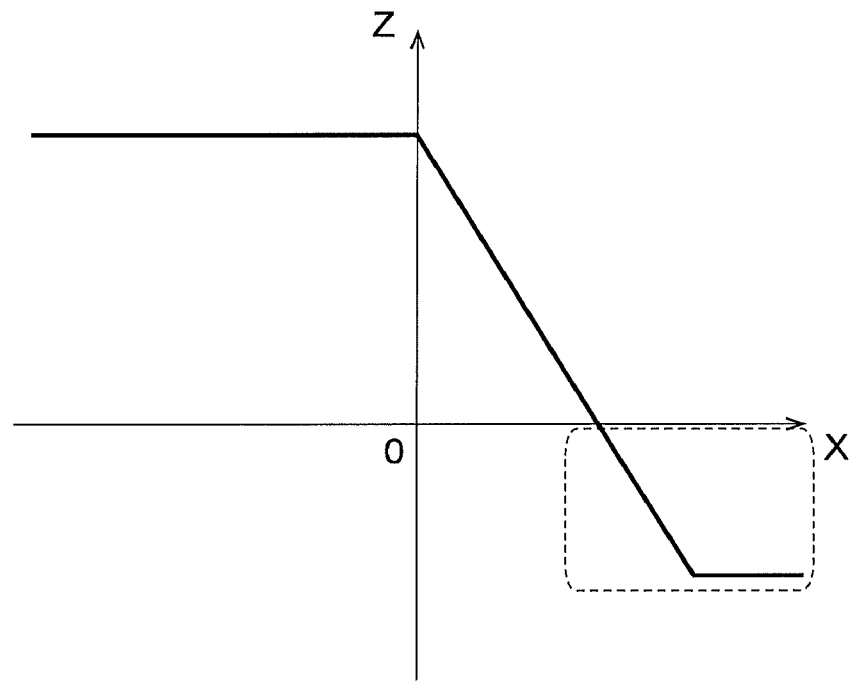
FIG. 8 is a diagram showing an exemplary hypothetical target shape of the resist according to the second embodiment.

At step S13 in the embodiment, the hypothetical target shape is set, based on the thickness data of the resist shown in FIG. 7, to a shape having a thickness in the −Z direction, in other words, having a hypothetically negative thickness as shown the dotted-line region in FIG. 8.

Figure 9:
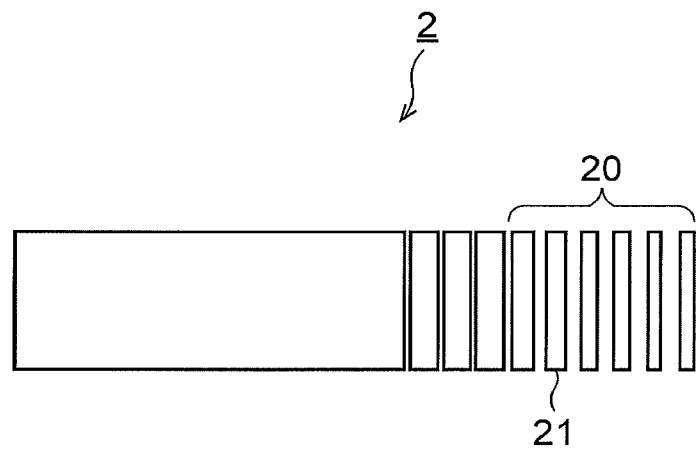
FIG. 9 is a diagram showing an exemplary pattern of a photomask according to the second embodiment.

In addition, at step S16 in the embodiment, a pattern of a photomask 2 as shown in FIG. 9 is created based on the hypothetical target shape shown in FIG. 8. An auxiliary pattern 20 corresponding to a part having the above-described negative thickness is created at an end part of the photomask 2. The auxiliary pattern 20 includes a plurality of light-shielding areas 21.

Therefore, according to the embodiment, each light-shielding area 21 restricts transmission of light when defocus occurs. Accordingly, the energy of light reaching the resist can be reduced. In this manner, the embodiment can avoid failed shaping of the resist due to defocus.

Third Embodiment

Figure 10:
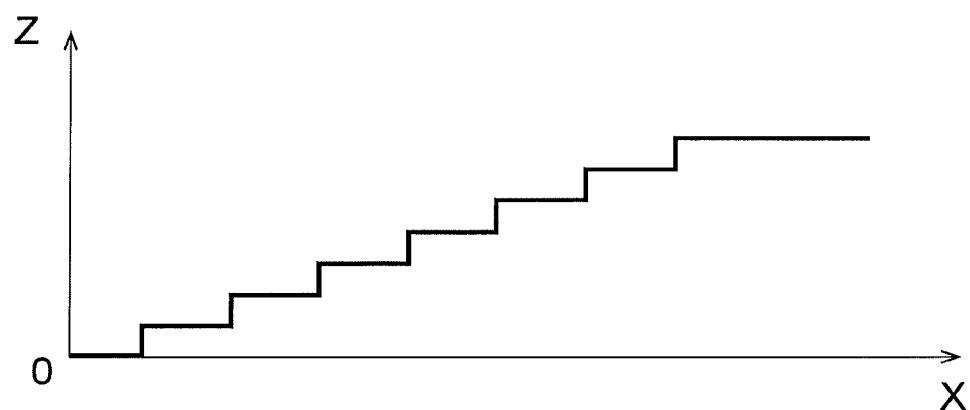
FIG. 10 is a diagram showing an exemplary target shape of a resist according to a third embodiment.

In a third embodiment, a pattern of a photomask is created through steps similarly to those of the first embodiment shown in FIG. 1. However, at step S11 in the embodiment, the target shape of the resist is a stair-shaped as shown in FIG. 10. Thus, the hypothetical target shape (not shown) set at step S13 is a stair-shaped obtained by correcting the target shape based on the development characteristic of the resist in the horizontal direction.

Figure 11:
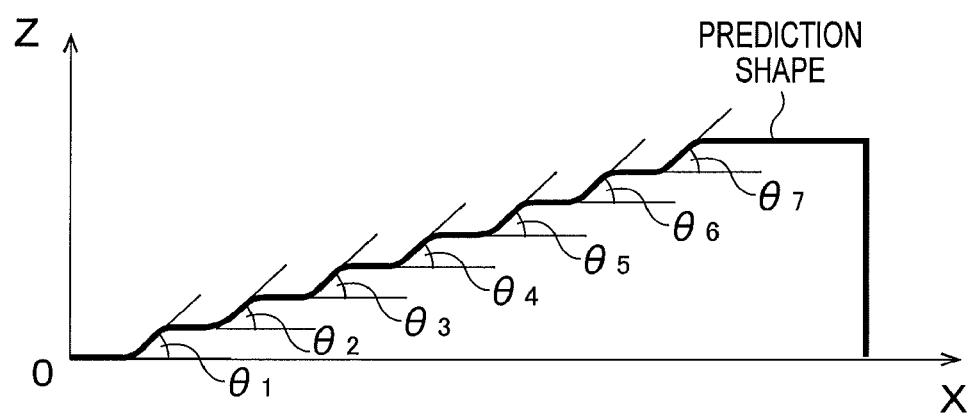
FIG. 11 is a diagram showing an exemplary prediction shape of the resist according to the third embodiment.

At step S18 in the embodiment, the cost function is calculated by using Expression (4) below. In Expression (4), "EPE" represents the edge placement error described in the first embodiment. "$\theta_k$" represents an angle of each step of a prediction shape created through simulation as shown in FIG. 11. "$\theta_{tgt}$" represents the angle of each step of the hypothetical target shape.

$$C.F. = w1\sqrt{\frac{\sum_{i=0}^{N}(EPEi)^2}{N}} + w2\sum_{k=1}^{M}\sqrt{\frac{\sum_{k=0}^{M}(\theta_k - \theta_{tgt})^2}{M}} \quad (4)$$

The EPE and an angle difference between the prediction shape and the hypothetical target shape have a trade-off relation. The units of the EPE and the angle are different from each other. Thus, in the embodiment, this relation is expressed by using a weighting coefficient w1 (first weighting coefficient) and a weighting coefficient w2 (second weighting coefficient) as in Expression (4). Specifically, the cost function adds a shape error obtained by multiplying the RMS of the EPE with the weighting coefficient w1, to an angle error obtained by multiplying, with the weighting coefficient w2, the sum of the RMS of an angle difference between the prediction shape and the hypothetical target shape at each step.

In the embodiment, at step S18, when the sum of the shape error and the angle error does not meet the termination condition of the pattern adjustment, the exposure condition and each light-shielding area 11 are adjusted again by using a numerical value optimization algorithm that minimizes this sum. As a result, an optimum pattern of the photomask for forming the resist into the stair-shaped is derived.

According to the embodiment described above, the cost function includes the angle error of each step in addition to the shape error of the EPE. Then, the pattern of the photomask is adjusted to minimize these two errors. Accordingly, the stair-shaped of the resist can be highly accurately controlled.

In the embodiment, too, when the stair-shaped of the resist is simulated under a plurality of exposure conditions, the pattern of the photomask is optimized through the cost function that takes into account the shape error and the angle error of each exposure condition. Accordingly, influence of fluctuation in, for example, the exposure amount on the stair-shaped of the resist can be minimized.

When applied to, for example, formation of a stair-shaped at an end part of a stacked body in which memory cells are stacked, the manufacturing method of a photomask according to the embodiment can achieve reduced fluctuation in size and angle.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a photomask, the method comprising:

setting an exposure condition applied when a resist is formed into a three-dimensional target shape by using a photomask including a plurality of light-shielding areas;
setting a hypothetical target shape obtained by correcting the target shape based on a development characteristic of the resist for the exposure condition;
creating a pattern of the photomask corresponding to the hypothetical target shape;
simulating a prediction shape of the resist when the pattern is used;
calculating a cost function related to an error between the prediction shape and the hypothetical target shape; and
adjusting the pattern based on a result of the calculation of the cost function.

2. The manufacturing method of claim 1, wherein
the hypothetical target shape includes a part having a hypothetically negative thickness, and
an auxiliary pattern corresponding to the part is created at an end part of the pattern.

3. The manufacturing method of claim 1, wherein
the prediction shape is simulated for each of a plurality of the exposure conditions, and the cost function is calculated by using an error between each prediction shape and the hypothetical target shape.

4. The manufacturing method of claim 1, wherein
the pattern is optimized through calculation of the cost function by using a numerical value optimization algorithm that minimizes the error.

5. The manufacturing method of claim 1, wherein
the error includes an edge placement error (EPE).

6. The manufacturing method of claim 5, wherein
the target shape is a stair-shaped, and
the cost function is calculated by adding a shape error obtained by multiplying the root mean square (RMS) of the edge placement error with a first weighting coefficient, and an angle error obtained by multiplying, with a second weighting coefficient, the sum of the root mean square (RMS) of an angle difference between the hypothetical target shape and the prediction shape at each step.

7. The manufacturing method of claim 1, wherein
the adjustment of the pattern is terminated when a calculated value of the cost function is equal to or less than a threshold, or when the number of times of calculation of the cost function reaches a predetermined number of times.

8. The manufacturing method of claim 1, wherein
the exposure condition is set based on data indicating the target shape and thickness data of the resist remaining for an exposure amount.

9. The manufacturing method of claim 1, wherein
the pattern is adjusted by changing at least one of the size and position of the light-shielding area.

10. A non-transitory recording medium recording a computer-readable program, the program comprising:

setting an exposure condition applied when a resist is formed into a three-dimensional target shape by using a photomask including a plurality of light-shielding areas;
setting a hypothetical target shape obtained by correcting the target shape based on a development characteristic of the resist for the exposure condition;
creating a pattern of the photomask corresponding to the hypothetical target shape;
simulating a prediction shape of the resist when the pattern is used;

calculating a cost function related to an error between the prediction shape and the hypothetical target shape; and adjusting the pattern based on a result of the calculation of the cost function.

* * * * *